United States Patent
Ting et al.

(10) Patent No.: US 11,362,630 B2
(45) Date of Patent: Jun. 14, 2022

(54) AMPLIFYING CIRCUIT AND RECTIFYING ANTENNA

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Tien Lun Ting, Beijing (CN); Xiangzhong Kong, Beijing (CN); Lei Wang, Beijing (CN); Ken Wen, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 293 days.

(21) Appl. No.: 16/607,828

(22) PCT Filed: Nov. 29, 2018

(86) PCT No.: PCT/CN2018/118208
§ 371 (c)(1),
(2) Date: Oct. 24, 2019

(87) PCT Pub. No.: WO2019/205629
PCT Pub. Date: Oct. 31, 2019

(65) Prior Publication Data
US 2021/0359656 A1    Nov. 18, 2021

(30) Foreign Application Priority Data

Apr. 25, 2018  (CN) .......................... 201810378591.4

(51) Int. Cl.
*H03F 1/02*    (2006.01)
*H03F 3/45*    (2006.01)
(Continued)

(52) U.S. Cl.
CPC ......... *H03F 3/45475* (2013.01); *H01Q 1/248* (2013.01); *H03F 1/26* (2013.01);
(Continued)

(58) Field of Classification Search
CPC ................. H03F 1/02; H03F 3/45; H03F 1/07
(Continued)

(56) References Cited

U.S. PATENT DOCUMENTS 4,132,954 A * 1/1979 Sidhu ................. G11B 23/0007
327/552
4,320,351 A * 3/1982 Brown, Jr. ................ H03F 3/68
330/260
(Continued)

FOREIGN PATENT DOCUMENTS

AU      2279683 A    12/1983
CN      2499986 Y    7/2002
(Continued)

OTHER PUBLICATIONS

First Office Action issued by the Chinese Patent Office in the priority Chinese application No. 201810378591.4 dated Jan. 2, 2020 and its English translation.
(Continued)

*Primary Examiner* — Henry Choe
(74) *Attorney, Agent, or Firm* — Dilworth & Barrese, LLP.; Michael J. Musella, Esq.

(57) ABSTRACT

An amplifying circuit and a rectifying antenna are provided. The amplifying circuit includes: a first rectifying circuit, configured to output a first direct current signal according to a first alternating current signal; a second rectifying circuit, configured to output a second direct current signal according to a second alternating current signal; a differential amplifying circuit, configured to receive the first direct current signal and the second direct current signal, amplify a difference between the first direct current signal and the second direct current signal, and output an amplified difference between the first direction current signal and the second
(Continued)

direct current, the first direct current signal and the second direct current signal have directions opposite to each other.

19 Claims, 2 Drawing Sheets

(51) Int. Cl.
*H01Q 1/24* (2006.01)
*H03F 1/26* (2006.01)
*H03F 3/195* (2006.01)

(52) U.S. Cl.
CPC ....... *H03F 3/195* (2013.01); *H03F 2200/451* (2013.01); *H03F 2203/45568* (2013.01); *H03F 2203/45594* (2013.01)

(58) Field of Classification Search
USPC ........................................ 330/124 R, 295, 69
See application file for complete search history.

(56) References Cited

U.S. PATENT DOCUMENTS

| | | | |
|---|---|---|---|
| 7,822,390 B2 | 10/2010 | Essabar | |
| 10,027,187 B2* | 7/2018 | Matthews | ............. H02J 50/001 |
| 10,811,991 B2 | 10/2020 | Tsuru et al. | |
| 2007/0041601 A1 | 2/2007 | Essabar | |
| 2008/0315995 A1 | 12/2008 | Okuda | |
| 2011/0062790 A1* | 3/2011 | Kouki | ..................... H02J 50/27 307/104 |
| 2011/0095818 A1* | 4/2011 | Sullivan | ................... G01R 1/20 330/124 R |
| 2011/0175812 A1* | 7/2011 | Hsien | ...................... H02J 7/025 345/163 |
| 2012/0280877 A1* | 11/2012 | Chirila | ................... H01Q 5/364 343/787 |
| 2015/0078420 A1 | 3/2015 | Geurts et al. | |
| 2016/0359378 A1 | 12/2016 | Kuhn et al. | |
| 2017/0288301 A1* | 10/2017 | Rumpf | ............... H01Q 15/0086 |

FOREIGN PATENT DOCUMENTS

| | | |
|---|---|---|
| CN | 1921331 A | 2/2007 |
| CN | 101329742 A | 12/2008 |
| CN | 104348434 A | 2/2015 |
| CN | 106450802 A | 2/2017 |
| JP | H09148974 A | 6/1997 |
| WO | 2005043678 A1 | 5/2005 |
| WO | 2017216839 A1 | 12/2017 |

OTHER PUBLICATIONS

Extended European Search Report from European Patent Application No. 18915786.0 dated Dec. 6, 2021.

* cited by examiner

1

AMPLIFYING CIRCUIT AND RECTIFYING ANTENNA

The present application claims priority of China Patent application No. 201810378591.4 filed on Apr. 25, 2018, the content of which is incorporated in its entirety as portion of the present application by reference herein.

TECHNICAL FIELD

Embodiments of the present disclosure relate to an amplifying circuit and a rectifying antenna.

BACKGROUND

A rectifying antenna is a mainstream method of electromagnetic wave detection, and it is very helpful for effectively detecting electromagnetic waves to improve sensitivity of the rectifying antenna. In general, methods for improving sensitivity include a method of increasing antenna gains, a method of reducing losses of filter and rectifier, and a method of using low-noise amplifiers; traditional rectifying antennas, as limited by antenna gains and transmission losses, usually improve sensitivity of electromagnetic wave detection by using the low-noise amplifiers; however, prices of the low-noise amplifiers of the antennas are quite high, so that overall costs are increased.

SUMMARY

At least one embodiment of the present disclosure provides an amplifying circuit, which includes: a first rectifying circuit, configured to output a first direct current signal according to an alternating current signal; a second rectifying circuit, configured to output a second direct current signal according to the alternating current signal; a differential amplifying circuit, configured to receive the first direct current signal and the second direct current signal, amplify a difference between the first direct current signal and the second direct current signal, and output an amplified difference between the first direction current signal and the second direct current signal, the first direct current signal and the second direct current signal have directions opposite to each other.

For example, in the amplifying circuit provided by an embodiment of the present disclosure, the first rectifying circuit includes a first input terminal configured to receive an alternating current signal, and a first output terminal configured to output the first direct current signal; and the second rectifying circuit includes a second input terminal configured to receive an alternating current signal, and a second output terminal configured to output the second direct current signal.

For example, in the amplifying circuit provided by an embodiment of the present disclosure, the first rectifying circuit further includes a first rectifier connected between the first input terminal and the first output terminal, and the first rectifier is configured to perform a half-wave rectification on the alternating current signal as received, to output a first pulsating direct current signal; and the second rectifying circuit further includes a second rectifier connected between the second input terminal and the second output terminal, and the second rectifier is configured to perform a half-wave rectification on the alternating current signal as received, to output a second pulsating direct current signal; the first pulsating direct current signal and the second pulsating direct current signal have directions opposite to each other.

For example, in the amplifying circuit provided by an embodiment of the present disclosure, the first rectifier includes a first rectifier diode, a positive electrode of the first rectifier diode is grounded, and a negative electrode of the first rectifier diode is connected between the first input terminal and the first output terminal; and the second rectifier includes a second rectifier diode, a negative electrode of the second rectifier diode is grounded, and a positive electrode of the second rectifier diode is connected between the second input terminal and the second output terminal.

For example, in the amplifying circuit provided by an embodiment of the present disclosure, the first rectifying circuit further includes a first band-pass filter and a first low-pass filter; the first band-pass filter is connected between the first input terminal and the first rectifier, and is configured to perform a band-pass filtering on the alternating current signal input from the first input terminal, and output a band-pass filtered signal to the first rectifier; and the first low-pass filter is connected between the first rectifier and the differential amplifying circuit, and is configured to perform a low-pass filtering on the first pulsating direct current signal output by the first rectifier to output the first direct current signal.

For example, in the amplifying circuit provided by an embodiment of the present disclosure, the second rectifying circuit further includes a second band-pass filter and a second low-pass filter; the second band-pass filter is connected between the second input terminal and the second rectifier, and is configured to perform a band-pass filtering on the alternating current signal input from the second input terminal, and output a band-pass filtered signal to the second rectifier; and the second low-pass filter is connected between the second rectifier and the differential amplifying circuit, and is configured to perform a low-pass filtering on the second pulsating direct current signal output from the second rectifier to output a second direct current signal.

For example, in the amplifying circuit provided by an embodiment of the present disclosure, the differential amplifying circuit includes a differential amplifier; a positive-going input terminal of the differential amplifier is connected with the second output terminal of the second rectifying circuit; a negative-going input terminal of the differential amplifier is connected with the first output terminal of the first rectifying circuit; and an output terminal of the differential amplifier serves as an output terminal of the differential amplifying circuit.

For example, in the amplifying circuit provided by an embodiment of the present disclosure, the differential amplifier includes an operational amplifier, a first resistor, a second resistor, a third resistor and a fourth resistor, one terminal of the first resistor is connected with a negative-going input terminal of the operational amplifier, and the other terminal of the first resistor serves as the negative-going input terminal of the differential amplifier; one terminal of the second resistor is connected with a positive-going input terminal of the operational amplifier, and the other terminal of the second resistor serves as the positive-going input terminal of the differential amplifier; two terminals of the third resistor are respectively connected with the negative-going input terminal and an output terminal of the operational amplifier; two terminals of the fourth resistor are respectively connected with the positive-going input terminal of the operational amplifier and the ground; and the output terminal of the operational amplifier serves as the output terminal of the differential amplifier.

At least one embodiment of the present disclosure provides a rectifying antenna, which includes: an antenna module, configured to receive an electromagnetic wave signal and convert it into an alternating current signal; a first rectifying circuit, configured to output a corresponding first direct current signal according to the alternating current signal generated by the antenna module; a second rectifying circuit, configured to output a second direct current signal according to the alternating current signal generated by the antenna module; and a differential amplifying circuit, configured to receive the first direct current signal and the second direct current signal, amplify a difference between the first direct current signal and the second direct current signal and output an amplified difference between the first direction current signal and the second direct current signal, the first direct current signal and the second direct current signal have directions opposite to each other.

For example, in the rectifying antenna provided by an embodiment of the present disclosure, the antenna module includes two receiving antennas, and the two receiving antennas are connected with the first rectifying circuit and the second rectifying circuit in one-to-one correspondence.

For example, in the rectifying antenna provided by an embodiment of the present disclosure, the antenna module includes a receiving antenna and a power distribution unit connected with the receiving antenna; and the power distribution unit is configured to equally divide an alternating current signal output by the receiving antenna into two ways of alternating current signals of a same power, and respectively output the two ways of alternating current signals to the first rectifying circuit and the second rectifying circuit.

For example, in the rectifying antenna provided by an embodiment of the present disclosure, the power distribution unit includes a 2-way power splitter; an input terminal of the 2-way power splitter is connected with the receiving antenna, and two output terminals of the 2-way power splitter are respectively connected with the first rectifying circuit and the second rectifying circuit.

For example, in the rectifying antenna provided by an embodiment of the present disclosure, the first rectifying circuit includes a first input terminal configured to receive the alternating current signal generated by the antenna module, and a first output terminal configured to output the first direct current signal; and the second rectifying circuit includes a second input terminal configured to receive the alternating current signal generated by the antenna module, and a second output terminal configured to output the second direct current signal; wherein the first input terminal and the second input terminal are respectively connected with the antenna module.

For example, in the rectifying antenna provided by an embodiment of the present disclosure, the first rectifying circuit includes a first rectifier connected between the antenna module and the differential amplifying circuit; the first rectifier is configured to perform a half-wave rectification on the alternating current signal as received, to output a first pulsating direct current signal; the first direct current signal is the first pulsating direct current signal or a filtered signal of the first pulsating direct current signal, the second rectifying circuit includes a second rectifier connected between the antenna module and the differential amplifying circuit; the second rectifier is configured to perform a half-wave rectification on the alternating current signal as received, to output a second pulsating direct current signal; and the second direct current signal is the second pulsating direct current signal or a filtered signal of the second pulsating direct current signal.

For example, in the rectifying antenna provided by an embodiment of the present disclosure, the first rectifying circuit further includes a first band-pass filter and a first low-pass filter, the first band-pass filter is connected between the antenna module and the first rectifier, and is configured to perform a band-pass filtering on the alternating current signal generated by the antenna module, and output a band-pass filtered signal to the first rectifier; the first low-pass filter is connected between the first rectifier and the differential amplifying circuit, and is configured to perform a low-pass filtering on the first pulsating direct current signal output by the first rectifier, to output the first direct current signal.

For example, in the rectifying antenna provided by an embodiment of the present disclosure, the first rectifier includes a first rectifier diode; and a positive electrode of the first rectifier diode is grounded, and a negative electrode of the first rectifier diode is connected with an output terminal of the first band-pass filter and an input terminal of the first low-pass filter.

For example, in the rectifying antenna provided by an embodiment of the present disclosure, the second rectifying circuit further includes a second band-pass filter and a second low-pass filter, the second band-pass filter is connected between the antenna module and the second rectifier, and is configured to perform a band-pass filtering on the alternating current signal generated by the antenna module, and output a band-pass filtered signal to the second rectifier; the second low-pass filter is connected between the second rectifier and the differential amplifying circuit, and is configured to perform a low-pass filtering on the second pulsating direct current signal output by the second rectifier to output the second direct current signal.

For example, in the rectifying antenna provided by an embodiment of the present disclosure, the second rectifier includes a second rectifier diode; and a negative electrode of the second rectifier diode is grounded, and a positive electrode of the second rectifier diode is connected with an output terminal of the second band-pass filter and an input terminal of the second low-pass filter.

For example, in the rectifying antenna provided by an embodiment of the present disclosure, the differential amplifying circuit includes a differential amplifier; a positive-going input terminal of the differential amplifier is connected with the second output terminal of the second rectifying circuit; a negative-going input terminal of the differential amplifier is connected with the first output terminal of the first rectifying circuit; and an output terminal of the differential amplifier serves as an output terminal of the differential amplifying circuit.

For example, in the rectifying antenna provided by an embodiment of the present disclosure, the differential amplifier includes an operational amplifier, a first resistor, a second resistor, a third resistor and a fourth resistor, one terminal of the first resistor is connected with a negative-going input terminal of the operational amplifier, and the other terminal of the first resistor serves as the negative-going input terminal of the differential amplifier; one terminal of the second resistor is connected with a positive-going input terminal of the operational amplifier, and the other terminal of the second resistor serves as the positive-going input terminal of the differential amplifier; two terminals of the third resistor are respectively connected with the negative-going input terminal and an output terminal of the operational amplifier; two terminals of the fourth resistor are respectively connected with the positive-going input terminal of the operational amplifier and the ground; and the output terminal of the operational amplifier serves as the output terminal of the differential amplifier.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

REFERENCE SIGNS

Figure 1:
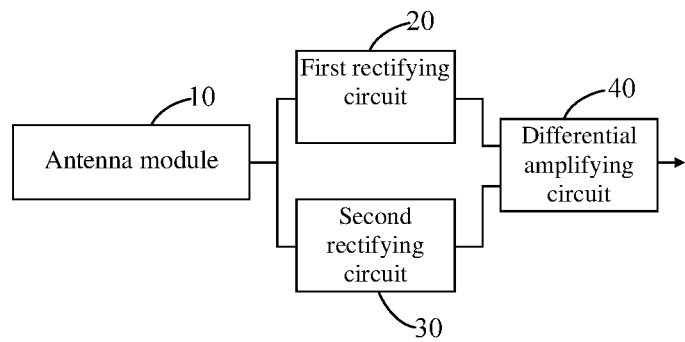
FIG. 1 is a structural schematic diagram of modules of a rectifying antenna provided by the present disclosure.

10—antenna module; 11—receiving antenna; 12—power distribution unit; 12a-2—way power splitter; 20—first rectifying circuit; 21—first band-pass filter; 22—first low-pass filter; 23—first rectifier; 30—second rectifying circuit; 31—second band-pass filter; 32—second low-pass filter; 33—second rectifier; 40—differential amplifying circuit; 41—operational amplifier; 201—first input terminal; 202—first output terminal; 301—second input terminal; 302—second output terminal.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The terms "connection", "connected" and the like are not limited to physical or mechanical connection but may include electrical connection, either directly or indirectly.

Embodiments of the present disclosure provide an amplifying circuit and a rectifying antenna. The amplifying circuit includes a first rectifying circuit, configured to output a corresponding first direct current signal according to an alternating current signal; a second rectifying circuit, configured to output a corresponding second direct current signal according to the alternating current signal; a differential amplifying circuit, configured to receive the first direct current signal and the second direct current signal, amplify a difference between the first direct current signal and the second direct current signal and output an amplified difference between the first direction current signal and the second direct current signal; the first direct current signal and the second direct current signal have directions opposite to each other. The amplifying circuit can improve sensitivity of the rectifying antenna with relatively lower costs.

Hereinafter, the amplifying circuit and the rectifying antenna provided by the embodiments of the present disclosure will be described in detail in conjunction with the accompanying drawings.

An embodiment of the present disclosure provides a rectifying antenna; FIG. 1 is a structural schematic diagram of modules of the rectifying antenna provided by the present disclosure. As illustrated by FIG. 1, the rectifying antenna includes an antenna module 10, a first rectifying circuit 20, a second rectifying circuit 30 and a differential amplifying circuit 40. The antenna module 10 is configured to receive an electromagnetic wave signal and convert the electromagnetic wave signal into a corresponding alternating current signal, and specifically may include at least one receiving antenna. The first rectifying circuit 20 is configured to output a corresponding first direct current signal according to the alternating current signal generated by the antenna module 10. The second rectifying circuit 30 is configured to output a corresponding second direct current signal according to the alternating current signal generated by the antenna module 10; and the first direct current signal and the second direct current signal have directions opposite to each other, that is, the first direct current signal and the second direct current signal are opposite to each other of being positive or negative, and have magnitudes which are either the same or different from each other. The differential amplifying circuit 40 is configured to receive the first direct current signal and the second direct current signal, amplify a difference between the first direct current signal and the second direct current signal and output an amplified difference between the first direction current signal and the second direct current signal. An output terminal of the differential amplifying circuit 40 serves as an output terminal of the rectifying antenna, and the rectifying antenna converts the electromagnetic wave signal into a direct current signal and amplifies the direct current signal, so that a subsequent detector determines a magnitude of the electromagnetic wave by detecting the direct current signal as amplified.

In this embodiment, the alternating current signal output by the antenna module 10, after rectified by the first rectifying circuit 20 and the second rectifying circuit 30, forms two direct current signals opposite to each other of being positive or negative; low noises in the two direct current signals are very close to each other, in this way, upon the two direct current signals entering the differential amplifying circuit 40, the low noises can at least partially cancel each other out, while a direct current component is amplified, which, thus, facilitates the subsequent detector to determine the magnitude of the electromagnetic wave, and further is favorable for improving sensitivity of the rectifying antenna in detecting the electromagnetic wave. In addition, as compared with a method of using a low-noise amplifier, the method for improving sensitivity of the rectifying antenna according to the present disclosure does not need impedance matching, so that it can be applied to different antennas; besides, the differential amplifying circuit 40 has relatively low costs, so that an overall cost of the rectifying antenna can be reduced.

Figure 2:
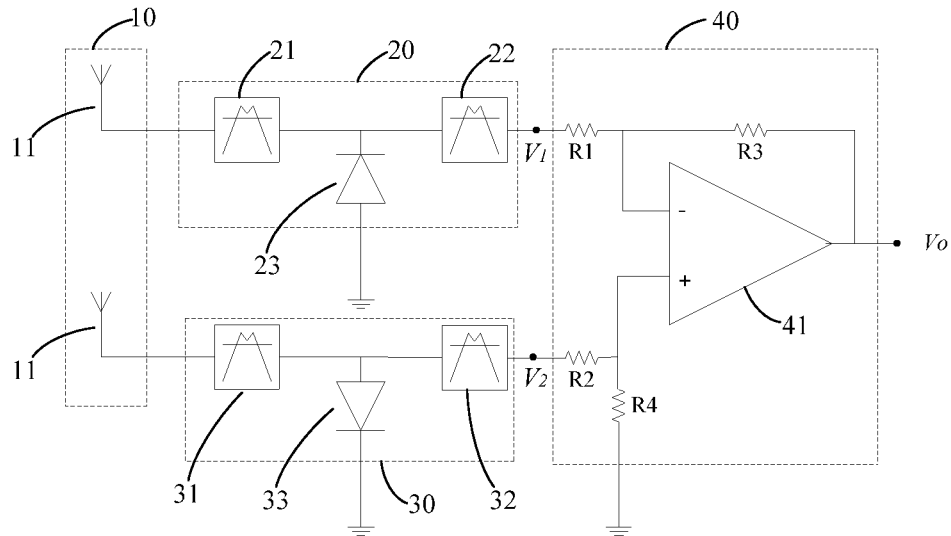
FIG. 2 is a structural schematic diagram of a rectifying antenna provided by the present disclosure.

FIG. 2 is a structural schematic diagram of a rectifying antenna provided by an embodiment of the present disclosure. In combination with FIG. 1 and FIG. 2, the rectifying antenna comprises an antenna module 10, a first rectifying circuit 20, a second rectifying circuit 30 and a differential amplifying circuit 40. The above-described first direct current signal is a positive-going signal, and the second direct current signal is a negative-going signal.

For example, the antenna module 10 includes two receiving antennas 11, and the two receiving antennas 11 are connected with an input terminal of the first rectifying circuit 20 and an input terminal of the second rectifying circuit 30 in one-to-one correspondence. The receiving antenna 11 may specifically be a dipole antenna, a microstrip patch antenna, a fan antenna, and so on. In addition, in order to reduce a size of the rectifying antenna, the receiving antenna 11 may have a compact antenna structure or a multilayer antenna structure.

The first rectifying circuit 20 may be implemented in a half-wave rectification mode, and specifically includes a first rectifier 23 (shown in FIG. 2) connected between the antenna module 10 and the differential amplifying circuit 40; the first rectifier 23 is configured to perform a half-wave rectification on the alternating current signal as received, to output a first pulsating direct current signal. A connection between the first rectifier 23 and the antenna module 10 may be a direct connection or an indirect connection; and a connection between the first rectifier 23 and the differential amplifying circuit 40 may also be a direct connection or an indirect connection, that is, the first direct current signal is the first pulsating direct current signal or a filtered signal of the first pulsating direct current signal. The first rectifier 23 may specifically include a first rectifier diode, one of a positive electrode and a negative electrode of the first rectifier diode is grounded, and the other one of the positive electrode and the negative electrode of the first rectifier diode is connected with the antenna module 10 and the differential amplifying circuit 40; and half-wave rectification is implemented by unidirectional conductivity of the first rectifier diode. Further, for example, the first rectifier diode may be a schottky diode with a better high-frequency characteristic and switching performance.

Usually, the alternating current signal converted by the receiving antenna 11 has a plurality of different frequencies; and in order to filter out a signal of a working frequency band, the first rectifying circuit 20 further includes a first band-pass filter 21 and a first low-pass filter 22. The first band-pass filter 21 is connected between the antenna module 10 and the first rectifier 23, and is configured to perform a band-pass filtering on the alternating current signal generated by the antenna module 10, and output a band-pass filtered signal to the first rectifier 23. The first low-pass filter 22 is connected between the first rectifier 23 and the differential amplifying circuit 40, and is configured to perform a low-pass filtering on the first pulsating direct current signal output by the first rectifier 23 to remove a high frequency component in the first pulsating direct current signal, so as to improve rectification efficiency. The signal output by the first low-pass filter 22 is the first direct current signal. An input terminal of the first band-pass filter 21 is connected with one of the receiving antennas 11, and an output terminal of the first band-pass filter 21 is connected with the negative electrode of the first rectifier diode; an input terminal of the first low-pass filter 22 is connected with the negative electrode of the first rectifier diode, and an output terminal of the first low-pass filter 22 is connected with a negative input terminal of the differential amplifying circuit 40; and the positive electrode of the first rectifier diode is grounded.

Like the first rectifying circuit 20, the second rectifying circuit 30 may also be implemented in a half-wave rectification mode, for example, as illustrated by FIG. 2, the second rectifying circuit 30 includes a second rectifier 33 connected between the antenna module 10 and the differential amplifying circuit 40; the second rectifier 33 is configured to perform a half-wave rectification on the alternating current signal as received, to output a second pulsating direct current signal; and the second direct current signal is the second pulsating direct current signal or a filtered signal of the second pulsating direct current signal. The second rectifier diode may be a schottky diode with a better high frequency characteristic and switching performance.

Further, as illustrated by FIG. 2, the second rectifying circuit 30 further includes a second band-pass filter 31 and a second low-pass filter 32. The second band-pass filter 31 is connected between the antenna module 10 and the second rectifier 33, and is configured to perform a band-pass filtering on the alternating current signal generated by the antenna module 10, and output a band-pass filtered signal to the second rectifier 33. The second low-pass filter 32 is connected between the second rectifier 33 and the differential amplifying circuit 40, and is configured to perform a low-pass filtering on the second pulsating direct current signal output by the second rectifier 33 to remove a high frequency component in the second pulsating direct current signal, so as to improve rectification efficiency. The signal output by the second low-pass filter 32 is just the second direct current signal. An input terminal of the second band-pass filter 31 is connected with the other receiving antenna 11, and an output terminal of the second band-pass filter 31 is connected with a positive electrode of the second rectifier diode; an input terminal of the second low-pass filter 32 is connected with the positive electrode of the second rectifier diode, and an output terminal of the second low-pass filter 32 is connected with a positive-going input terminal of the differential amplifying circuit 40; and a negative electrode of the first rectifier diode is grounded.

The structures of the first band-pass filter 21 and the second band-pass filter 31 are not limited, and both of the first band-pass filter 21 and the second band-pass filter 31 may be butterworth band-pass filters; and structures of the first low-pass filter 22 and the second low-pass filter 32 are not limited, and both of the first band-pass filter 21 and the second band-pass filter 31 may be butterworth low-pass filters or chebyshev low-pass filters.

The differential amplifying circuit 40 includes a differential amplifier; a positive-going input terminal of the differential amplifier is connected with an output terminal of the second rectifying circuit 30 (i.e., the output terminal of the second low-pass filter 32); a negative-going input terminal of the differential amplifier is connected with an output terminal of the first rectifying circuit 20 (i.e., the output terminal of the first low-pass filter 22); and an output terminal of the differential amplifier serves as an output terminal of the differential amplifying circuit 40.

The differential amplifier is specifically a four-resistor differential amplifier, to simplify a structure of the differential amplifier. For example, as illustrated by FIG. 2, the differential amplifier includes an operational amplifier 41, a first resistor R1, a second resistor R2, a third resistor R3 and a fourth resistor R4. One terminal of the first resistor R1 is connected with a negative-going input terminal of the operational amplifier 41, and the other terminal of the first resistor R1 serves as the negative-going input terminal of the differential amplifier; one terminal of the second resistor R2 is connected with a positive-going input terminal of the operational amplifier 41, and the other terminal of the second resistor R2 forms the positive-going input terminal of the differential amplifier; two terminals of the third resistor R3 are respectively connected with the negative-going input terminal and an output terminal of the operational amplifier 41; two terminals of the fourth resistor R4 are respectively connected with the positive-going input terminal of the operational amplifier 41 and the ground; and the output terminal of the operational amplifier 41 forms the output terminal of the differential amplifier. In this case, a voltage $V_0$ of the direct current signal at the output terminal of the differential amplifier, a voltage $V_1$ at the output terminal of the first rectifying circuit 20, a voltage $V_2$ at the output terminal of the second rectifying circuit 30, a resistance $R_1$ of the first resistor R1, a resistance $R_2$ of the second resistor R2, a resistance $R_3$ of the third resistor R3 and a resistance $R_4$ of the fourth resistor R4 satisfy formula (1):

$$V_0 = -V_1\left(\frac{R_3}{R_1}\right) + V_2\left(\frac{R_4}{R_2 + R_4}\right)\left(\frac{R_1 + R_3}{R_1}\right) \quad (1)$$

Where, the resistance $R_1$ of the first resistor R1 and the resistance $R_2$ of the second resistor R2 may be equal to each other; the resistance $R_3$ of the third resistor R3 and the resistance $R_4$ of the fourth resistor R4 may be equal to each other; in this case, $V_0=(R_3/R_1)*(V_2-V_1)$. Because low noise components in voltages $V_2$ and $V_1$ are close to each other, after subtraction of $V_2$ and $V_1$, the low noises can partially cancel each other out or even be completely eliminated. In addition, $V_2$ and $V_1$ are reciprocal numbers to each other, and after subtraction of the $V_2$ and $V_1$, then multiplied by (R3/R1), an amplified voltage $V_0$ is obtained.

It can be understood that, in this embodiment, only the four-resistor differential amplifier is taken as an example to describe the structure of the differential amplifier and the output voltage of the differential amplifier; however, the present disclosure is not limited thereto, and the differential amplifier may be of other structures, for example, a three-operational amplifying differential amplifier, etc.

Figure 3:
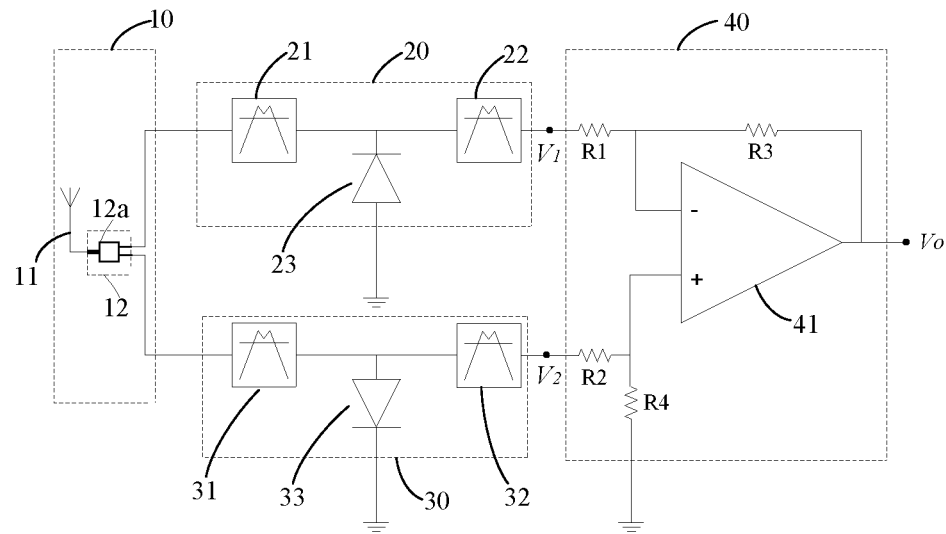
FIG. 3 is a structural schematic diagram of another rectifying antenna provided by the present disclosure.

FIG. 3 is a structural schematic diagram of another rectifying antenna provided by the present disclosure. The rectifying antenna in FIG. 3 differs from the rectifying antenna in FIG. 2 only in the structure of the antenna module 10. For example, as illustrated by FIG. 3, the antenna module 10 includes a receiving antenna 11 and a power distribution unit 12 connected with the receiving antenna 11, and the power distribution unit 12 is configured to equally divide an alternating current signal output by the receiving antenna 11 into two ways of alternating current signals of a same power, and respectively output the two ways of alternating current signals to the first rectifying circuit 20 and the second rectifying circuit 30. The power distribution unit 12 specifically includes a 2-way power splitter 12a; an input terminal of the 2-way power splitter 12a is connected with the receiving antenna 11, and two output terminals of the 2-way power splitter 12a are respectively connected with the first rectifying circuit 20 and the second rectifying circuit 30, that is, respectively connected with the input terminal of the first band-pass filter 21 and the input terminal of the second band-pass filter 31. The 2-way power splitter 12a may specifically be a Wilkinson power splitter and a two-wire binary splitter, etc. which have a simple structure.

In the second configuration, specific structures of the first rectifying circuit 20, the second rectifying circuit 30 and the differential amplifying circuit 40 are the same as those in the first configuration, and a voltage $V_0$ output by the differential amplifying circuit 40 also satisfies the above-described formula (1), which will not be repeated here.

Figure 4:
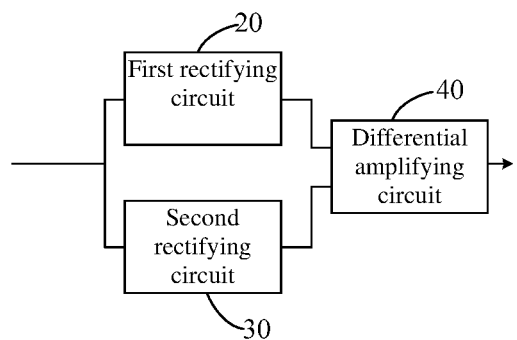
FIG. 4 is a structural schematic diagram of modules of an amplifying circuit provided by an embodiment of the present disclosure.

An embodiment of the present disclosure further provides an amplifying circuit. FIG. 4 is a structural schematic diagram of modules of the amplifying circuit provided by the embodiment of the present disclosure. As illustrated by FIG. 4, the amplifying circuit includes: a first rectifying circuit 20, configured to output a corresponding first direct current signal according to an alternating current signal; a second rectifying circuit 30, configured to output a corresponding second direct current signal according to the alternating current signal; and a differential amplifying circuit 40, configured to receive the first direct current signal and the second direct current signal, amplify a difference between the first direct current signal and the second direct current signal and output an amplified difference between the first direction current signal and the second direct current signal; the first direct current signal and the second direct current signal have directions opposite to each other.

In the amplifying circuit provided by this embodiment, the alternating current signal as rectified by the first rectifying circuit 20 and the second rectifying circuit 30, forms two direct current signals opposite to each other of being positive or negative; low noises in the two direct current signals are very close to each other, so that, upon the two direct current signals entering the differential amplifying circuit 40, the low noises can at least partially cancel each other out, while a direct current component is amplified, which, thus, facilitates a subsequent detector to determine a magnitude of an electromagnetic wave, and further is favorable for improving sensitivity of a rectifying antenna of the amplifying circuit provided by this embodiment in detecting the electromagnetic wave. In addition, as compared with a mode of using a low-noise amplifier, the amplifying circuit provided by this embodiment does not need to have impedance matching performed, so that it can be applied to different antennas; and the differential amplifying circuit 40 has relatively low costs, so that an overall cost of the rectifying antenna can be reduced.

Figure 5:
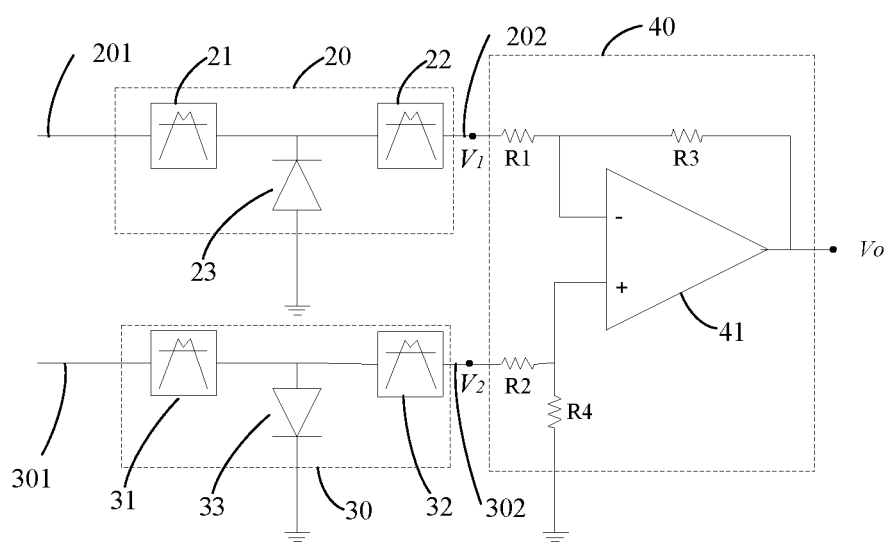
FIG. 5 is a structural schematic diagram of another amplifying circuit provided by an embodiment of the present disclosure.

FIG. 5 is a structural schematic diagram of another amplifying circuit provided by an embodiment of the present disclosure. As illustrated by FIG. 5, a first rectifying circuit 20 includes a first input terminal 201 configured to receive an alternating current signal, and a first output terminal 202 configured to output a first direct current signal; and a second rectifying circuit 30 includes a second input terminal 301 configured to receive an alternating current signal, and a second output terminal 302 configured to output a second direct current signal.

For example, as illustrated by FIG. 5, the first rectifying circuit 20 further includes a first rectifier 23 connected between the first input terminal 201 and the first output terminal 202, and the first rectifier 23 is configured to perform a half-wave rectification on the alternating current signal are received, to output a first pulsating direct current signal; and the second rectifying circuit 30 further includes a second rectifier 33 connected between the second input terminal 301 and the second output terminal 302, and the second rectifier 33 is configured to perform a half-wave rectification on the alternating current signal as received, to output a second pulsating direct current signal; the first pulsating direct current signal and the second pulsating direct current signal have directions opposite to each other.

The first pulsating direct current signal and the second pulsating direct current signal are opposite to each other of being positive or negative, and have magnitudes which are either the same or different from each other.

For example, as illustrated by FIG. 5, the first rectifier 23 includes a first rectifier diode 23, a positive electrode of the first rectifier diode 23 is grounded, and a negative electrode of the first rectifier diode 23 is connected between the first input terminal 201 and the first output terminal 202; the second rectifier 33 includes a second rectifier diode 33, a negative electrode of the second rectifier diode 33 is grounded, and a positive electrode of the second rectifier diode 33 is connected between the second input terminal 301 and the second output terminal 302. Related description of the above-described embodiments may be referred to for specific structures of the first rectifier diode 23 and the second rectifier diode 33, which will not be repeated here.

For example, as illustrated by FIG. 5, the first rectifying circuit 20 further includes a first band-pass filter 21 and a first low-pass filter 22; the first band-pass filter 21 is connected between the first input terminal 201 and the first rectifier 23, and is configured to perform a band-pass filtering on the alternating current signal input from the first input terminal 201, and output the band-pass filtered signal to the first rectifier 23; and the first low-pass filter 22 is connected between the first rectifier 23 and a differential amplifying circuit 40, and is configured to perform a low-pass filtering on the first pulsating direct current signal output by the first rectifier 23 to output the first direct current signal. Related description of the above-described embodiments may be referred to for specific structures of the first band-pass filter 21 and the first low-pass filter 22, which will not be repeated here.

For example, as illustrated by FIG. 5, the second rectifying circuit 30 further includes a second band-pass filter 31 and a second low-pass filter 32; the second band-pass filter 31 is connected between the second input terminal 301 and the second rectifier 33, and is configured to perform a band-pass filtering on the alternating current signal input from the second input terminal 301, and output the band-pass filtered signal to the second rectifier 33; and the second low-pass filter 32 is connected between the second rectifier 33 and the differential amplifying circuit 40, and is configured to perform a low-pass filtering on the second pulsating direct current signal output from the second rectifier 33 to output the second direct current signal. Related description of the above-described embodiments may be referred to for specific structures of the second band-pass filter 31 and the second low-pass filter 32, which will not be repeated here.

For example, as illustrated by FIG. 5, the differential amplifying circuit 40 includes an operational amplifier 41, a first resistor R1, a second resistor R2, a third resistor R3 and a fourth resistor R4. The first resistor R1 has one terminal connected with a negative-going input terminal of the operational amplifier 41, and the other terminal serving as a negative-going input terminal of a differential amplifier; the second resistor R2 has one terminal connected with a positive-going input terminal of the operational amplifier 41, and the other terminal form a positive-going input terminal of the differential amplifier; two terminals of the third resistor R3 are respectively connected with the negative-going input terminal and an output terminal of the operational amplifier 41; two terminals of the fourth resistor R4 are respectively connected with the positive-going input terminal of the operational amplifier 41 and the ground; the output terminal of the operational amplifier 41 forms an output terminal of the differential amplifier. It should be noted that related description of the above-described embodiments may be referred to for relationships between a voltage $V_0$ of the direct current signal at the output terminal of the differential amplifier, a voltage $V_1$ at the output terminal of the first rectifying circuit 20, a voltage $V_2$ at the output terminal of the second rectifying circuit 30, a resistance $R_1$ of the first resistor R1, a resistance $R_2$ of the second resistor R2, a resistance $R_3$ of the third resistor R3 and a resistance $R_4$ of the fourth resistor R4, which will not be repeated here.

The following points should be noted:

(1) Unless otherwise defined, in the embodiments of the present disclosure and the drawings, the same reference numerals represent the same meaning.

(2) The accompanying drawings in the embodiments of the present disclosure only involve structures relevant to the embodiments of the present disclosure, and other structures may refer to the common design.

(3) For the sake of clarity, in the drawings used to describe embodiments of the present invention, the thickness of layers or regions is enlarged or reduced, i.e., these drawings are not drawn to actual scale. It will be understood that when an element such as a layer, film, region or substrate is referred to as being "on" or "under" another element, the element may be "directly" "on" or "under" the other element, or intervening elements may be present The foregoing is only the embodiments of the present disclosure and not intended to limit the scope of protection of the present disclosure, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. An amplifying circuit, comprising:
   a first rectifying circuit, configured to output a first direct current signal according to a first alternating current signal;
   a second rectifying circuit, configured to output a second direct current signal according to a second alternating current signal;
   a differential amplifying circuit, configured to receive the first direct current signal and the second direct current signal, amplify a difference between the first direct current signal and the second direct current signal, and output an amplified difference between the first direction current signal and the second direct current signal,
   wherein the first direct current signal and the second direct current signal have directions opposite to each other,
   the first rectifying circuit further comprises a first rectifier connected between the first input terminal and the first output terminal, and the first rectifier is configured to perform a half-wave rectification on the first alternating current signal as received, to output a first pulsating direct current signal; and
   the second rectifying circuit further comprises a second rectifier connected between the second input terminal and the second output terminal, and the second rectifier is configured to perform a half-wave rectification on the second alternating current signal as received, to output a second pulsating direct current signal;
   wherein the first pulsating direct current signal and the second pulsating direct current signal have directions opposite to each other.

2. The amplifying circuit according to claim 1, wherein the first rectifying circuit comprises a first input terminal configured to receive the first alternating current signal, and a first output terminal configured to output the first direct current signal; and the second rectifying circuit comprises a second input terminal configured to receive the second alternating current signal, and a second output terminal configured to output the second direct current signal.

3. The amplifying circuit according to claim 1, wherein the first rectifier comprises a first rectifier diode, a positive electrode of the first rectifier diode is grounded, and a negative electrode of the first rectifier diode is connected between the first input terminal and the first output terminal; and the second rectifier comprises a second rectifier diode, a negative electrode of the second rectifier diode is grounded, and a positive electrode of the second rectifier diode is connected between the second input terminal and the second output terminal.

4. The amplifying circuit according to claim 1, wherein the first rectifying circuit further comprises a first band-pass filter and a first low-pass filter;

the first band-pass filter is connected between the first input terminal and the first rectifier, and is configured to perform a band-pass filtering on the first alternating current signal input from the first input terminal, and output a band-pass filtered signal to the first rectifier; and the first low-pass filter is connected between the first rectifier and the differential amplifying circuit, and is configured to perform a low-pass filtering on the first pulsating direct current signal output by the first rectifier to output the first direct current signal.

5. The amplifying circuit according to claim 1, wherein the second rectifying circuit further comprises a second band-pass filter and a second low-pass filter;

the second band-pass filter is connected between the second input terminal and the second rectifier, and is configured to perform a band-pass filtering on the second alternating current signal input from the second input terminal, and output a band-pass filtered signal to the second rectifier; and the second low-pass filter is connected between the second rectifier and the differential amplifying circuit, and is configured to perform a low-pass filtering on the second pulsating direct current signal output from the second rectifier to output a second direct current signal.

6. The amplifying circuit according to claim 1, wherein the differential amplifying circuit comprises a differential amplifier; a positive-going input terminal of the differential amplifier is connected with the second output terminal of the second rectifying circuit; a negative-going input terminal of the differential amplifier is connected with the first output terminal of the first rectifying circuit; and an output terminal of the differential amplifier serves as an output terminal of the differential amplifying circuit.

7. The amplifying circuit according to claim 6, wherein the differential amplifier comprises an operational amplifier, a first resistor, a second resistor, a third resistor and a fourth resistor, one terminal of the first resistor is connected with a negative-going input terminal of the operational amplifier, and the other terminal of the first resistor serves as the negative-going input terminal of the differential amplifier;

one terminal of the second resistor is connected with a positive-going input terminal of the operational amplifier, and the other terminal of the second resistor serves as the positive-going input terminal of the differential amplifier;

two terminals of the third resistor are respectively connected with the negative-going input terminal and an output terminal of the operational amplifier;

two terminals of the fourth resistor are respectively connected with the positive-going input terminal of the operational amplifier and the ground; and the output terminal of the operational amplifier serves as the output terminal of the differential amplifier.

8. A rectifying antenna, comprising:

an antenna module, configured to receive an electromagnetic wave signal and convert it into an alternating current signal;

a first rectifying circuit, configured to output a corresponding first direct current signal according to the alternating current signal generated by the antenna module;

a second rectifying circuit, configured to output a second direct current signal according to the alternating current signal generated by the antenna module; and a differential amplifying circuit, configured to receive the first direct current signal and the second direct current signal, amplify a difference between the first direct current signal and the second direct current signal and output an amplified difference between the first direction current signal and the second direct current signal, wherein the first direct current signal and the second direct current signal have directions opposite to each other, the first rectifying circuit comprises a first rectifier connected between the antenna module and the differential amplifying circuit; the first rectifier is configured to perform a half-wave rectification on the alternating current signal as received, to output a first pulsating direct current signal; the first direct current signal is the first pulsating direct current signal or a filtered signal of the first pulsating direct current signal, the second rectifying circuit comprises a second rectifier connected between the antenna module and the differential amplifying circuit; the second rectifier is configured to perform a half-wave rectification on the alternating current signal as received, to output a second pulsating direct current signal; and the second direct current signal is the second pulsating direct current signal or a filtered signal of the second pulsating direct current signal.

9. The rectifying antenna according to claim 8, wherein the antenna module comprises two receiving antennas, and the two receiving antennas are connected with the first rectifying circuit and the second rectifying circuit in one-to-one correspondence.

10. The rectifying antenna according to claim 8, wherein the antenna module comprises a receiving antenna and a power distribution unit connected with the receiving antenna; and the power distribution unit is configured to equally divide an alternating current signal output by the receiving antenna into two ways of alternating current signals of a same power, and respectively output the two ways of alternating current signals to the first rectifying circuit and the second rectifying circuit.

11. The rectifying antenna according to claim 10, wherein the power distribution unit comprises a 2-way power splitter; an input terminal of the 2-way power splitter is connected with the receiving antenna, and two output terminals of the 2-way power splitter are respectively connected with the first rectifying circuit and the second rectifying circuit.

12. The rectifying antenna according to claim 8, wherein the first rectifying circuit comprises a first input terminal configured to receive the alternating current signal generated by the antenna module, and a first output terminal configured to output the first direct current signal; and
    the second rectifying circuit comprises a second input terminal configured to receive the alternating current signal generated by the antenna module, and a second output terminal configured to output the second direct current signal;
    wherein the first input terminal and the second input terminal are respectively connected with the antenna module.

13. The rectifying antenna according to claim 8, wherein the first rectifying circuit further comprises a first band-pass filter and a first low-pass filter,
    the first band-pass filter is connected between the antenna module and the first rectifier, and is configured to perform a band-pass filtering on the alternating current signal generated by the antenna module, and output a band-pass filtered signal to the first rectifier;
    the first low-pass filter is connected between the first rectifier and the differential amplifying circuit, and is configured to perform a low-pass filtering on the first pulsating direct current signal output by the first rectifier, to output the first direct current signal.

14. The rectifying antenna according to claim 13, wherein the first rectifier includes a first rectifier diode; and a positive electrode of the first rectifier diode is grounded, and a negative electrode of the first rectifier diode is connected with an output terminal of the first band-pass filter and an input terminal of the first low-pass filter.

15. The rectifying antenna according to claim 8, wherein the second rectifying circuit further comprises a second band-pass filter and a second low-pass filter,
    the second band-pass filter is connected between the antenna module and the second rectifier, and is configured to perform a band-pass filtering on the alternating current signal generated by the antenna module, and output a band-pass filtered signal to the second rectifier;
    the second low-pass filter is connected between the second rectifier and the differential amplifying circuit, and is configured to perform a low-pass filtering on the second pulsating direct current signal output by the second rectifier to output the second direct current signal.

16. The rectifying antenna according to claim 15, wherein the second rectifier comprises a second rectifier diode; and a negative electrode of the second rectifier diode is grounded, and a positive electrode of the second rectifier diode is connected with an output terminal of the second band-pass filter and an input terminal of the second low-pass filter.

17. The rectifying antenna according to claim 8, wherein the differential amplifying circuit comprises a differential amplifier; a positive-going input terminal of the differential amplifier is connected with the second output terminal of the second rectifying circuit; a negative-going input terminal of the differential amplifier is connected with the first output terminal of the first rectifying circuit; and an output terminal of the differential amplifier serves as an output terminal of the differential amplifying circuit.

18. The rectifying antenna according to claim 17, wherein the differential amplifier comprises an operational amplifier, a first resistor, a second resistor, a third resistor and a fourth resistor,
    one terminal of the first resistor is connected with a negative-going input terminal of the operational amplifier, and the other terminal of the first resistor serves as the negative-going input terminal of the differential amplifier;
    one terminal of the second resistor is connected with a positive-going input terminal of the operational amplifier, and the other terminal of the second resistor serves as the positive-going input terminal of the differential amplifier;
    two terminals of the third resistor are respectively connected with the negative-going input terminal and an output terminal of the operational amplifier;
    two terminals of the fourth resistor are respectively connected with the positive-going input terminal of the operational amplifier and the ground; and
    the output terminal of the operational amplifier serves as the output terminal of the differential amplifier.

19. An amplifying circuit, comprising:
    a first rectifying circuit, configured to output a first direct current signal according to a first alternating current signal;
    a second rectifying circuit, configured to output a second direct current signal according to a second alternating current signal;
    a differential amplifying circuit, configured to receive the first direct current signal and the second direct current signal, amplify a difference between the first direct current signal and the second direct current signal, and output an amplified difference between the first direction current signal and the second direct current signal,
    wherein the first direct current signal and the second direct current signal have directions opposite to each other, the differential amplifying circuit comprises a differential amplifier; a positive-going input terminal of the differential amplifier is connected with the second output terminal of the second rectifying circuit; a negative-going input terminal of the differential amplifier is connected with the first output terminal of the first rectifying circuit; and an output terminal of the differential amplifier serves as an output terminal of the differential amplifying circuit,
    the differential amplifier comprises an operational amplifier, a first resistor, a second resistor, a third resistor and a fourth resistor,
    one terminal of the first resistor is connected with a negative-going input terminal of the operational amplifier, and the other terminal of the first resistor serves as the negative-going input terminal of the differential amplifier;
    one terminal of the second resistor is connected with a positive-going input terminal of the operational amplifier, and the other terminal of the second resistor serves as the positive-going input terminal of the differential amplifier;
    two terminals of the third resistor are respectively connected with the negative-going input terminal and an output terminal of the operational amplifier;
    two terminals of the fourth resistor are respectively connected with the positive-going input terminal of the operational amplifier and the ground; and the output terminal of the operational amplifier serves as the output terminal of the differential amplifier.

* * * * *